US008381164B2

(12) United States Patent
Baum et al.

(10) Patent No.: US 8,381,164 B2
(45) Date of Patent: Feb. 19, 2013

(54) METHOD AND SYSTEM OF INTELLIGENT INTERACTIVE GRAPHICS ELECTRICAL PLUG MAP TO ANALYZE TEXT AND DISTANCES BETWEEN ELECTRICAL CONTACTS AND PHYSICAL LAYOUT FILE BUILDER

(75) Inventors: Lawrence S. Baum, Bellevue, WA (US); John H. Boose, Bellevue, WA (US); Molly L. Boose, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 1195 days.

(21) Appl. No.: 11/392,063

(22) Filed: Mar. 28, 2006

(65) Prior Publication Data

US 2007/0236504 A1 Oct. 11, 2007

(51) Int. Cl.
*G06F 17/50* (2006.01)
*G06F 3/33* (2006.01)
*G06F 3/048* (2006.01)
*G06F 17/00* (2006.01)
*G06F 5/00* (2006.01)
*G06F 17/30* (2006.01)

(52) U.S. Cl. ........ 716/139; 716/119; 716/110; 715/762; 715/763; 345/418; 345/595; 345/650; 707/796; 707/804; 707/805

(58) Field of Classification Search .................. 707/609, 707/610, 611, 705, 821, 828–830, 796, 804–805; 702/118, 58, 65; 382/141, 145; 715/200–215, 715/231, 234–237, 239, 240–243, 253–256, 715/762–763; 345/619, 441, 522, 418, 595, 345/650; 700/180, 182, 100–107, 118, 121; 716/14, 52, 55, 139, 112, 110, 119
See application file for complete search history.

(56) References Cited

U.S. PATENT DOCUMENTS 5,482,833 A * 1/1996 Pero et al. .......................... 435/6
(Continued)

FOREIGN PATENT DOCUMENTS

| EP | 1074927 | * | 2/2001 |
| EP | 1930829 | * | 6/2008 |

(Continued)

OTHER PUBLICATIONS

Monjy Rabemanantsoa et al. "An artificial intelligence approach for generating assembly sequences in CAD CAM",Artijicial Intelligence in Engineering 10 (1996) 97-107.*

*Primary Examiner* — Srirama Channavajjala
(74) *Attorney, Agent, or Firm* — Hanley, Flight & Zimmerman LLC (57) ABSTRACT

The Intelligent Graphics Plug Map System automatically converts plug maps into Intelligent Graphics with intelligent behaviors. The electronic trouble shooting system enables users to easily navigate large quantities of interrelated data and accurately analyze how each plug is used. The system automatically integrates additional information such as the function of each contact, what signals are connected to the contact, and what tools and processes are required to repair or test electrical circuitry. The system provides an Intelligent Plug Map Recognizer that associates a correct contact label for each contact associated with a plug map file defining a plug map; an HTML Generator that generates an HTML file for the plug map; a CGM4 File Builder that generates an intelligent plug map file from the plug map file; and a technical data system application that synchronizes plug map views when a contact associated with the plug map is identified.

13 Claims, 7 Drawing Sheets

U.S. PATENT DOCUMENTS

| | | | | |
|---|---|---|---|---|
| 5,493,679 A * | 2/1996 | Virgil et al. | | 1/1 |
| 5,506,950 A * | 4/1996 | Hughes et al. | | 345/420 |
| 5,610,833 A * | 3/1997 | Chang et al. | | 716/115 |
| 5,894,310 A * | 4/1999 | Arsenault et al. | | 345/679 |
| 5,905,654 A * | 5/1999 | Tanino et al. | | 716/55 |
| 5,999,911 A * | 12/1999 | Berg et al. | | 705/7.26 |
| 6,099,581 A * | 8/2000 | Sakai | | 716/113 |
| 6,177,942 B1 * | 1/2001 | Keong et al. | | 715/810 |
| 6,289,254 B1 * | 9/2001 | Shimizu et al. | | 700/96 |
| 6,360,236 B1 * | 3/2002 | Khan et al. | | 715/207 |
| 6,552,732 B1 * | 4/2003 | Davis et al. | | 345/619 |
| 6,606,731 B1 * | 8/2003 | Baum et al. | | 716/3 |
| 6,766,331 B2 * | 7/2004 | Shema et al. | | 1/1 |
| 6,801,814 B1 * | 10/2004 | Wilson et al. | | 700/90 |
| 6,820,046 B1 * | 11/2004 | Lamson et al. | | 703/14 |
| 6,850,946 B1 * | 2/2005 | Rappaport et al. | | 707/796 |
| 7,013,247 B2 * | 3/2006 | Fujioka | | 703/1 |
| 7,047,180 B1 * | 5/2006 | Mathews et al. | | 703/27 |
| 7,246,328 B2 * | 7/2007 | Boose et al. | | 715/805 |
| 7,561,742 B2 * | 7/2009 | Boose et al. | | 382/190 |
| 2002/0040256 A1 * | 4/2002 | Fujioka | | 700/97 |
| 2003/0036983 A1 * | 2/2003 | Hougen et al. | | 705/28 |
| 2003/0098862 A1 * | 5/2003 | Hunt et al. | | 345/418 |
| 2003/0135846 A1 * | 7/2003 | Jayaram et al. | | 717/137 |
| 2004/0143806 A1 * | 7/2004 | Kodama et al. | | 716/5 |
| 2004/0268283 A1 * | 12/2004 | Perry et al. | | 716/11 |
| 2005/0088437 A1 * | 4/2005 | Vaidya et al. | | 345/420 |
| 2005/0183043 A1 * | 8/2005 | Wu et al. | | 716/1 |
| 2006/0136860 A1 * | 6/2006 | Boshart et al. | | 716/18 |
| 2006/0190116 A1 * | 8/2006 | Almeida et al. | | 700/102 |
| 2008/0141205 A1 * | 6/2008 | Kumagai | | 716/11 |

FOREIGN PATENT DOCUMENTS

| | | | |
|---|---|---|---|
| EP | 2063367 | * | 5/2009 |
| WO | WO 2005/033912 | * | 4/2005 |

* cited by examiner

REAR VIEW OF CONNECTOR

Figure 10

REAR VIEW OF CONNECTOR

METHOD AND SYSTEM OF INTELLIGENT INTERACTIVE GRAPHICS ELECTRICAL PLUG MAP TO ANALYZE TEXT AND DISTANCES BETWEEN ELECTRICAL CONTACTS AND PHYSICAL LAYOUT FILE BUILDER

FIELD OF THE INVENTION

The present invention generally relates to automatic generation of intelligent plug maps and plug map interconnectivity data for use in the field of complex electrical systems.

BACKGROUND

Complex systems, such as modern aircrafts, can involve hundreds of miles of wiring. Wires are used to distribute power and data to various types of electrical equipment. These connections are accomplished by terminating groups of wires together with a plug which mates with a receptacle or jack in the equipment. The electrical contacts (pins or sockets) in the plug will match the contacts in the jack. It is critical to the safety and performance of the system that the correct wires be connected to the correct contacts in the plug. Furthermore, when trouble shooting a wiring problem, the user must understand how each signal corresponds to each contact in a plug. The same plug part can be used many different times in a system for many different purposes and there is no inherent function associated with a contact. Because plugs can have over a hundred contacts, this can be a daunting task and users use plug maps to aid in this analysis.

The same plug part can be used many different times in a system for many different purposes and there is no inherent function associated with a contact.

Currently, maintenance users look up information to find correspondences among contacts and wires on wiring diagrams, wire lists, plug maps, equipment lists, part lists, etc. This data exists in manuals and tables including thousands of pages for a single aircraft. Finding the relationships among the various data sources is tedious and error-prone. Even when this data is migrated from paper-based documents to digital data, these problems still exist. There is a need for tools to establish the relationships among this data and efficiently present the information to the maintenance users.

This information can be added to a system manually, however it is cost-prohibitive and error-prone. There is a system that can automatically generate plug maps for the purpose of generating paper diagrams, but it does not automatically create intelligent diagrams that automatically link to associated wiring information.

In order to fully understand a system, it is important to integrate the views provided by plug maps with other graphic and tabular data such as locator views, wire lists and schematic diagrams. For example, when trouble shooting a problem, the user might begin with a locator graphic which focuses attention on a specific plug. Using existing plug maps, the user would then have to browse through the library of plug maps looking for the correct plug map. For plugs with many contacts, it is easy to select the wrong plug map by mistake. Once the correct plug map is found, the user faces the difficult task of linking individual contacts to specific wires in wiring diagrams.

While existing devices suit their intended purpose, there remains a need for a system that can generate plug maps and automatically creates intelligent diagrams that automatically links to associated wiring information.

SUMMARY

Generally, the present invention provides an Intelligent Graphics Plug Map System that automatically understands the relationship between the physical plug and the representation of it in a plug map diagram or graphic (hereinafter "plug map"). Once the relationship is understood, explicit links can be automatically inserted into the digital data so that all relevant information is provided to maintenance users when they are performing maintenance tasks associated with plug maps.

A method of using the Intelligent Graphics Plug Map System device is also provided.

BRIEF DESCRIPTION OF THE DRAWINGS

These and other objects, features and advantages of the present invention will become apparent from the following detailed description and the appended drawings in which.

DETAILED DESCRIPTION OF THE INVENTION

The present inventions now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

The Intelligent Graphics Plug Map System automatically converts plug maps into Intelligent Graphics with intelligent behaviors. It creates an electronic trouble shooting system that enables users to easily navigate large quantities of inter-related data and accurately analyze how a particular plug is used. The system automatically integrates additional information such as the function of each contact, what signals are connected to the contact, and what tools and processes are required to repair or test electrical circuitry.

The present system includes a software process and application that effectively integrates plug maps into a trouble shooting process. The present invention provides an efficient process that reduces the cost of trouble shooting contact damage and improves the accuracy of complex maintenance operations such as plug repair, wire repair or wire replacement.

The Intelligent Graphics Plug Map System analyzes drawings in CGM format (Computer Graphics Metafile), wherein CGM is the aerospace industry standard for the delivery of technical drawings. However, the system and method disclosed herein could work with any vector graphic file or with raster graphics such as scanned images of plug map diagrams.

Generally, the Intelligent Graphics Plug Map System provides: a plug map file associated with a particular plug having a corresponding plug map with least one contact associated therewith; an Intelligent Plug Map Recognizer that associates a correct contact label for each contact associated with the plug map; an HTML Generator that operates to generate an HTML file for the plug map; and a CGM4 File Builder that operates to generate an intelligent plug map file from the plug map file; and a technical data system application that operates to synchronize a plurality of plug map views identifying interconnectivity data associated with a corresponding plug when a contact associated with the plug map is identified.

Figure 1:
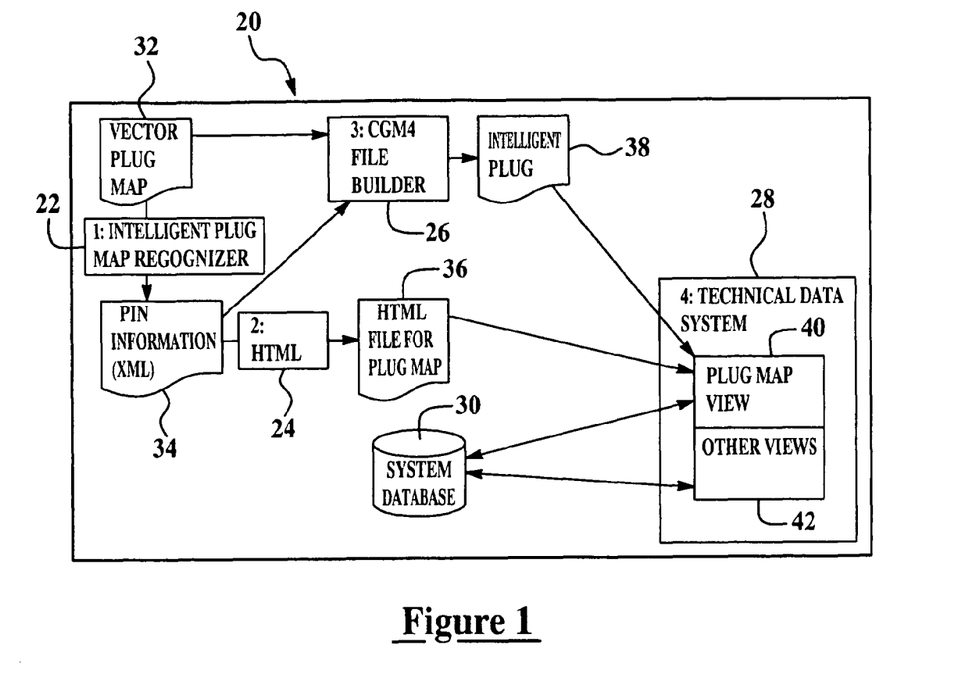
FIG. 1 illustrates a process flow diagram of an Intelligent Graphics Plug Map System in accordance with one aspect of the technology.

The Intelligent Graphics Plug Map System 20 is illustrated as a process flow diagram in FIG. 1.

As shown in FIG. 1, the Intelligent Graphics Plug Map System 20 provides an Intelligent Plug Map Recognizer 22, an HTML Generator 24, a CGM4 File Builder 26, and a Technical Data System 28 in electrical communication with a storage element.

The storage element may be a system database 30 as shown in FIG. 1 or any other type of storage device known to those skilled in the art. The storage element may be part of one or more of the client element(s) and/or one or more of the processing element(s) or may be separate from the client element(s) and the processing element(s) and in communication with one or all of the elements via the Internet, intranet or other computer network(s). Regardless of the configuration, if the storage element is a database, it may be accessed by other elements of the system via an interface, such as, but not limited to, a Common Object Request Broker Architecture (CORBA), active data object (ADO) interface or open database connectivity (ODBC) interface. The storage element therefore includes information regarding the wiring harnesses, wiring diagrams of the desired type of schematic and the connections among the connectors and components in an electrical system such as in an aircraft. The storage element may be populated in any manner known to those skilled in the art, from manually to automatically.

For example the storage element 30 may be at least partially populated using an electronic graphic recognition program, as described in U.S. Pat. No. 7,246,328, entitled "Method, Computer Program Product, and System for Performing Automated Linking Between Sheets of a Drawing Set," U.S. Pat. No. 6,766,331, entitled "Method, Computer Program Product, and System for Creating and Viewing an Intelligent Graphics File Including Parts Information," and U.S. Pat. No. 7,200,271, entitled, "Method, Computer Program Product, and System for Performing Automated Text Recognition and Text Search Within a Graphic File," all of which are incorporated herein in their entirety by reference.

Figure 2:
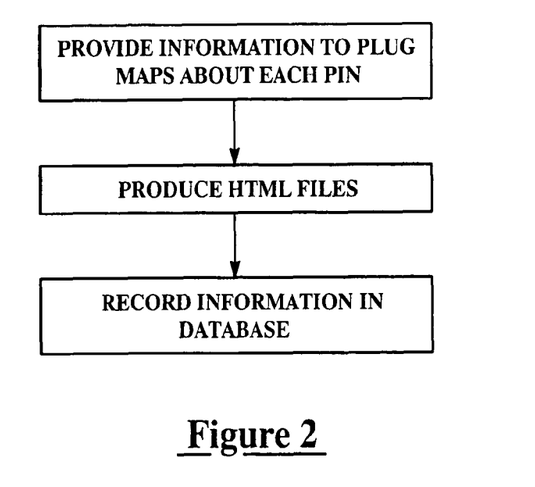
FIG. 2 illustrates a flowchart of the steps performed by the Intelligent Graphics Plug Map System in accordance with one aspect of the technology.

As shown in the flowchart depicted in FIG. 2, the present invention provides information to plug maps about each contact on an associated plug, produces HTML files to enable intelligent behaviors, and records information in an accompanying database to support the interaction of the plug maps with other modules in an electronic technical data system. Another system that use HTML files to enable intelligent behaviors is disclosed in See U.S. Pat. No. 7,200,271 the contents of which are herein incorporated by reference in its entirety.

The Intelligent Graphics Plug Map System applies Intelligent Graphics recognition technology, as shown in FIG. 2, to automatically determine the correct contact label for each contact in the plug map; automatically makes each contact an interactive object in the resulting intelligent graphic; and automatically links the intelligent plug maps with other data in an information system, enabling fast, reliable, task-focused navigation.

The Intelligent Plug Map Recognizer 22 operates to analyze a plug map graphic represented as a vector plug map file 32 in FIG. 1, in order to determine the correct contact label for each contact in the plug map. A variant of the present invention in which the input data is raster. There are raster-to-vector conversion software packages available commercially, though none, as yet, have all the functionality required for this invention.

The Intelligent Plug Map Recognizer 22 receives a plug map from a vector plug map file 32 and then labels the contacts associated with the plug map file 32 to create an XML contact information file 34. The XML contact information file 34 is then processed by the HTML generator 24 and by the CGM4 file builder 26. The HTML generator 24 then generates an HTML file 36 for a respective plug using the XML Contact Information file 34. The CGM4 file builder 26 generates Intelligent Plug Map file 38 that provides a CGM4 version of the plug map with a "hot spot" over each contact. The Technical Data System Application 28 operates to synchronize all vector plug map views and other plug map views designated as 40, and 42 in FIG. 1 when a user of the system performs an action that results in the identification of a specific contact.

The contact information, shown as contact information XML file in FIG. 1 is generated based on the results of the Intelligent Plug Map Recognizer 22.

FIG. 2 is a flowchart depicting the contact assignment stops of the Intelligent Plug Map Recognizer 22. The recognizer 22 starts by determining a type of contact layout being used in a particular plug map. Each type of layout requires a unique recognition strategy. Examples of layouts and recognition strategy follow.

Figure 3:
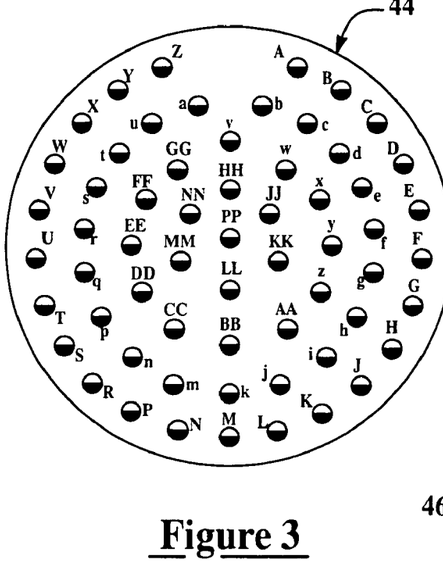
FIG. 3 illustrates a completely labeled plug map.

FIG. 3 shows a completely labeled plug map 44. In this case there is an explicit label for each contact. The recognizer 22 must associate each contact with the correct label. This is not simply a matter of matching each contact with the nearest label. Labels may be closer to the wrong contact. To solve this problem, the recognizer matches contacts and labels by assigning the labels to the contacts such that the sum of the distances among all of the contacts is minimized.

Figure 4:
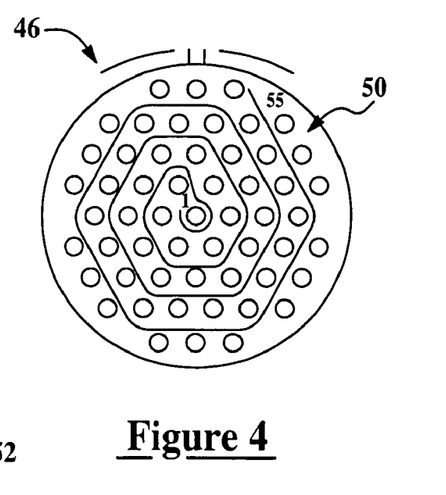
FIG. 4 illustrates a partially labeled spiral plug map.
Figure 5:
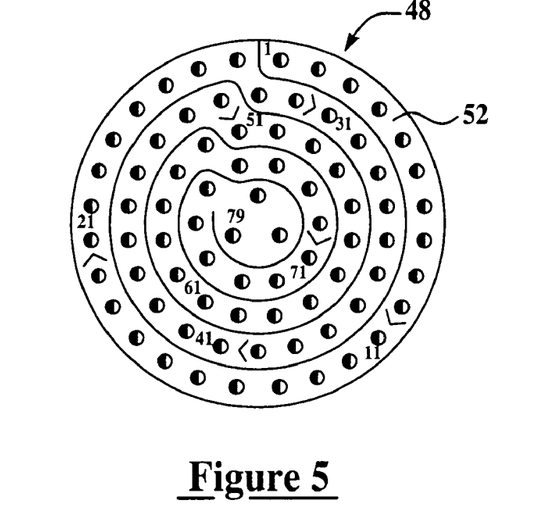
FIG. 5 illustrates a partially labeled spiral plug map.

FIGS. 4-5 shows two spiral plug maps 46, 48 that are partially labeled. The contacts are arranged either spiraling out from the center or spiraling in from the edge. There are lines and arcs that form the boundary of the spiral. In this case, there are contact labels to orient each map 46, 48. There is a contact labeled "1" and optional additional labels. The recognizer finds the outermost point of the spiral boundary and starts with an outermost circle of contacts closest to a point which is also closest to the label having either the highest or the lowest numerical value.

More particularly, a method of labeling a partially labeled spiral plug map provides the steps of:

identifying an outermost contact circle path defined by a plurality of circularly arranged contacts forming a spiral contact graphic boundary;

identifying a point which is closest to either a highest or a lowest numerically labeled contact on the outermost contact circle path;

compiling a list of contacts in a plurality of concentric contact circle paths in a clockwise manner when the highest numerically labeled contact is located on the outermost contact circle path;

compiling a list of contacts in a plurality of concentric contact circle paths in a counter-clockwise manner when the lowest numerically labeled contact is located on the outermost circle path;

incrementing inwardly one circle path from a completed revolution around a last circle path; and ending the identification process when each contact is identified in a list of all the contact circle paths in the map.

Thus, a completed spiral map list will have the contacts in the correct order starting from the outermost contact circle path to the innermost contact circle path.

Thus in the first map 46 shown in FIG. 4 the outermost point of the spiral boundary is shown as the outermost circle 50 beginning with label "55"; in the second example shown in FIG. 5 the recognizer 22 will choose the outermost circle closest to label "1" as a starting point. The recognizer 22 then proceeds clockwise or counterclockwise (depending on the spiral boundary) compiling a list of each circle it encounters until it completes a full revolution. The recognizer 22 then finds a next path of circles moving in toward a center of the map 46, 48 respectively and continues in this mode until it has built a list of all the contacts in each of the circle of contacts in each of the maps 46, 48. The list will have the contacts in the correct order starting from the first contact in the outermost circle inwardly to the innermost contact in the innermost circle. If the starting circle 52 is by the "1" label, then the recognizer 22 assigns labels "2", "3", etc. to each contact in the list in increasing numerical order, such as will be the case when the recognizer labels the contacts shown in FIG. 5. If the starting circle 50 is the last contact, then the list is reversed and the labels are assigned in reverse numerical order, such as will be the case when the recognizer labels the contacts shown in FIG. 4.

Figure 6:
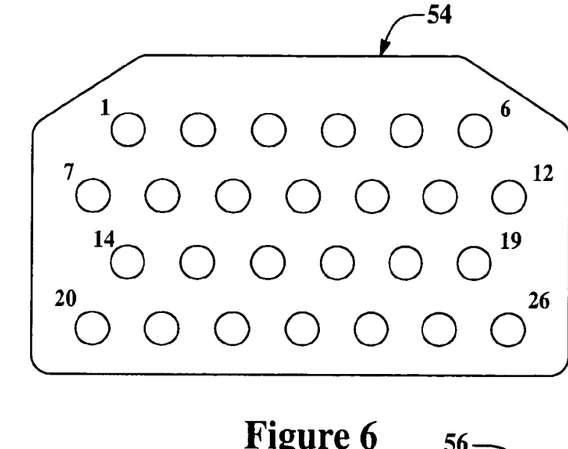
FIG. 6 illustrates a row and column contact arrangement plug map including partitions depicted between the rows or columns.
Figure 7:
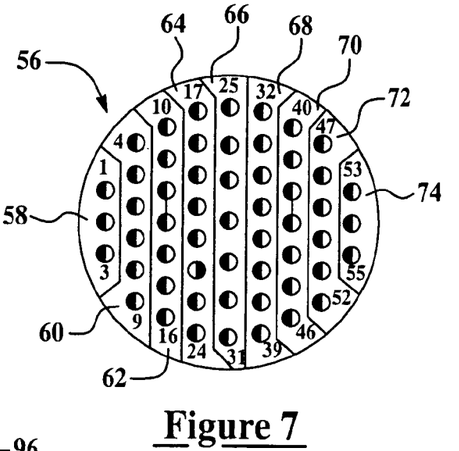
FIG. 7 illustrates a column oriented plug map having partitions depicted between the columns of the plug map.
Figure 8:
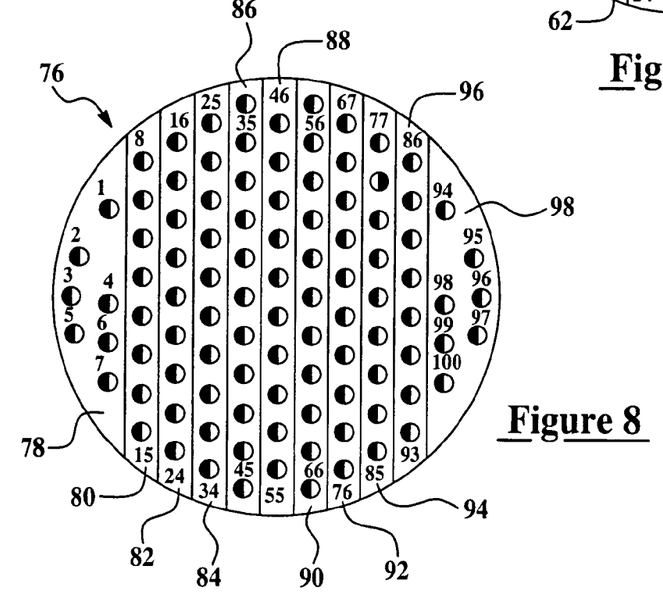
FIG. 8 illustrates another column-oriented plug map.

FIGS. 6-8 show three plug maps 54, 56, 76 with row and column contact arrangements, including partitions depicted between the rows or columns. The recognizer uses the explicit labels to determine if the layout is row or column oriented. For example, in the plug map 54 shown in FIG. 6, there are no explicit partitions but "1" and "6" are horizontally aligned, as are "7" and "12", "14" and "19", "20" and "26". This also informs the recognizer that the labeling should be left to right. The recognizer will build the list of contacts by starting at the upper left contact ("1") and gathering the contacts it finds from left to right in the first row; similarly for the $2^{nd}$ row, and so on. When the algorithm finishes, the list of contacts will be complete and in the correct order.

The column-oriented case is handled similarly for a column-oriented plug map 56 as shown in FIG. 7. However, in the plug map 56 shown in FIG. 7, the recognizer takes advantage of the partitions 58-74 drawn on the plug map. If there are labels for each contact in a partition 58, then the previously discussed label assignment algorithm is used on that subset of contacts.

In the map 76 shown in FIG. 8, the leftmost partition 78 has seven contacts and seven labels, so the label assignment algorithm is used. It also applies to the last partition 98 having contacts 94-100. In the other partitions 82-96, only the top and bottom contacts are labeled, so the column-oriented label assignment algorithm is used.

This invention extends to other layout schemes in which appropriate recognition strategies are applied.

For example, the recognizer 22 may use proximity-based algorithms, pattern-matching techniques, and logical inference to discover the text and symbols and to identify the relationships among the drawings. Thus, even if the text and/or symbols depicted in the vector plug file do not exactly match the text and symbol combinations in the list of patterns, the reference recognizer may look to the general similarities, such as a common format, font or the like, and nonetheless be able to identify the contacts and text in the drawing. Further details regarding text recognition and text search within graphic files is provided in U.S. Pat. No. 7,200,271 entitled The Method, Computer Program Product, and System for Performing Automated Text Recognition and Text Search within a Graphic File, the contents of which are incorporated herein by reference in their entirety.

The Intelligent Plug Map Recognizer generates an Extensible Markup Language (XML) representation of the recognized intelligent graphics (IG) objects. For each IG object, we write out an XML hierarchy of elements and attributes that completely define the intelligence extracted from the graphic. This XML representation is used to generate both an HTML file for plug and CGM version 4 intelligent plug file used by the Technical Data System.

The recognizer then generates an XML file shown below as Sample XML generated by the Recognizer 22.

```
<?xml version="1.0"?>
<!-- SGML based on DTD V4.0 -->
<igsheet type="WIRING DIAGRAM" descr="WIRING DIAGRAM"
gnbr="" fignbr="" sheetnbr="" ptpage="" revltr="" >
...
<para id="P3" hslistid="HS1" text="3">
3
</para>
<hslist id="HS3">
<hotspot>
<rect id="Rect1" left="10241" top="13580" width="714"
height="923">
</rect></hotspot></hslist>
<object id="contactObj3" role="TEXTREF" type="CONTACT"
magtext="Contact 3">
    <callout id="contactCallout3" hslistid="HScontact3">
        <textref id="contact3" type="CONTACT" name="3"
refloc="3">
1            </textref>
    </callout>
</object>
<hslist id="HScontact3">
    <hotspot>
        <rect left="10444" top="12317" width="2346"
```

-continued

```
height="2346">
        </rect>
    </hotspot>
</hslist>
...   additional objects for other contacts
</igsheet>
```

The resulting XML file is a concise and parse-able representation of the intelligence discovered during the recognition step. The XML file is used to generate the CGM Version 4 intelligent plug file 38, and is also useful for Quality Assurance and Testing purposes. For each contact, the XML file contains two objects. The first is a para object. This enables text search in the intelligent plug map. Thus the user can search for contact 3, for example, even though there is no explicit label "3" present in the map. The second is a textref structure; this enables the linking from the plug map to other views that relate to information about other connectors, components or wires connected to the contact. It also provides a tool tip (magtext="Contact 3") that will be exposed when the user points at the contact.

The HTML Generator

The HTML Generator 24 creates a companion HTML file for each plug map file 32. We generate a Hypertext Markup Language (HTML) representation of the XML contact information objects.

The following sample HTML file entitled "Function Handle MouseUp" is provided as a sample of automatically generated HTML.

```
Function HandleMouseUp(nMouseBtn_, lcc_, attr_id_)
    If (nMouseBtn_ = 1) Then
        Select Case attr_id_
            Case "contact1"
                lcc_.changeContactRefDes "1",
        lcc_.RefDes
            Case "contact2"
                lcc_.changeContactRefDes "2",
        lcc_.RefDes
            Case "contact3"
                lcc_.changeContactRefDes "3",
        lcc_.RefDes
            Case "contact4"
                lcc_.changeContactRefDes "4",
        lcc_.RefDes
            Case "contact5"
                lcc_.changeContactRefDes "5",
        lcc_.RefDes
        End Select
    End If
End Function ' HandleMouseUp'
```

The Technical Data System application provides connectivity data when the user clicks on a particular contact creating a contact hotspot. The HTML generator 24 works by translating each textref in the HTML file into a case to be handled by the HandleMouseUp function.

The Handle MouseUp function instructs the system to change the global context parameter contact reference design for a current highlighted contact. The global context parameter is then immediately relayed to all plug map and other views in the Technical Data System.

CGM4 File Builder

The intelligent CGM4 File Builder 26 is used to create a CGM4 version of the plug map with a 'hot spot' over each contact. The CGM4 File Builder uses the information in the contact information XML file 34 to create the CGM4 version of the plug map. The CGM Version 4 Intelligent Plug Map file 38 is generated using the XML file 34 and the original vector plug map file 32 as inputs. CGM Version 4 allows both the visual aspects of a graphic and the user-interface behaviors (such as automatic highlighting and magnification) to be encoded in a single file.

To build the CGM4 file, the software performs several steps. Initially; the XML contact information and source Plug Map files 34, 32 are opened and parsed. The content needed to generate the CGM4 Intelligent Plug Map file 38 is stored internally in memory. The CGM4 Header is written out. Next, all text in the XML content that is identified as a text label contact connection information, or a tool tip in label (i.e. a hotspot), is written in color to provide the user with visual feedback as to what text is selectable (hot). Then, hotspots for the plug maps and contacts are added to the CGM4 Intelligent file 38. The hotspots are written. The plug map, hotspot and text layers are written. And finally footer is written out.

When the user points at such a hot spot, the appropriate tool tip is displayed. When the user clicks a hot spot, that generates a mouseUp event configured to work with the above HandleMouseUp function. CGM4 File Builder is further described in U.S. Pat. No. 6,606,731 entitled Intelligent Wiring Diagram System, the contents of which are herein incorporated by reference in its entirety.

Technical Data System Application

The Technical Data System Application 28 synchronizes all plug map and views whenever the user performs an action that results in the identification of a specific contact. The maintenance user can easily explore all aspects of the relationships among all of the electrical components in a complex electrical system. The technical data system application 28 provides a plug map view 40 that provides vector and other plug map interconnectivity views 42 and stores the information in and retrieves information from the system database 30.

In order to perform a repair to a damaged contact, the user identifies what signal is connected to the damaged contact to determine if wires associated with the contact are connected correctly and to determine how to test the repair. To perform the repair, the user can access both the plug map and the wiring diagrams relevant to the repair. The Intelligent Graphics Plug Map System allows the user to efficiently analyze a plug repair task in a few seconds.

The system of the present invention and, in particular, the intelligent plug map recognizer, the HTML generator, the CGM4 file graphic builder, and the technical data application system are typically embodied by a processing element and an associated memory device, both of which are commonly comprised by a computer or the like. As such, the system of the present invention generally operates under control of a computer program product to provide the functionality described hereinabove in conjunction with the various components of the system, according to another aspect of the present invention. The computer program product for performing the contingent claim valuation includes a computer-readable storage medium, such as the non-volatile storage medium, and computer-readable program code portions, such as a series of computer instructions, embodied in the computer-readable storage medium.

In this regard, FIG. 1 is a block diagram and flowcharts of methods, systems and program products according to the invention. It will be understood that each block or step of the flowchart, and combinations of blocks in the flowchart, can be implemented by computer program instructions. These computer program instructions may be loaded onto a computer or other programmable apparatus to produce a machine, such that the instructions which execute on the computer or other programmable apparatus create means for implementing the functions specified in the flowchart block(s) or step(s). These computer program instructions may also be stored in a computer-readable memory that can direct a computer or other programmable apparatus to function in a particular manner, such that the instructions stored in the computer-readable memory produce an article of manufacture including instruction means which implement the function specified in the flowchart block(s) or step(s). The computer program instructions may also be loaded onto a computer or other programmable apparatus to cause a series of operational steps to be performed on the computer or other programmable apparatus to produce a computer implemented process such that the instructions which execute on the computer or other programmable apparatus provide steps for implementing the functions specified in the flowchart block(s) or step(s).

Accordingly, blocks or steps of the flowchart support combinations of means for performing the specified functions, combinations of steps for performing the specified functions and program instruction means for performing the specified functions. It will also be understood that each block or step of the flowchart, and combinations of blocks or steps in the flowchart, can be implemented by special purpose hardware-based computer systems which perform the specified functions or steps, or combinations of special purpose hardware and computer instructions.

Specific Example of System Function Invention Description

Figure 9:
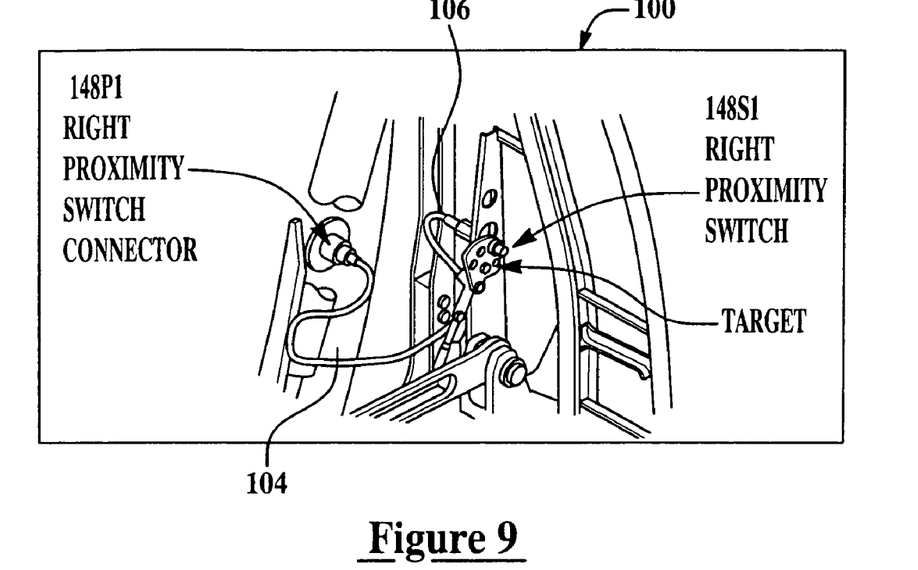
FIG. 9 illustrates a locator diagram used in combination with the Intelligent Graphics Plug Map System to diagnose a connector plug associated with the landing gear of an aircraft.

A user using the Intelligent Graphics Plug Map System 20, may repair diagnose and repair a damaged connector. FIGS. 9-16 illustrate use of the Intelligent Graphics Plug Map System 20 used to diagnose a connector associated with the landing gear of an aircraft. As used herein, the terminology "connector" and "plug" are used interchangeably to define any electrical component used to connect one component to another component. FIG. 9 illustrates locater diagram 100 a graphical representation of a right proximity switch, connector and harness for the landing gear of an aircraft having a right proximity switch connector 148P2, a right proximity switch 148S1, and associated wiring harnesses 104, 106 in between the connector and the switch.

Figure 10:
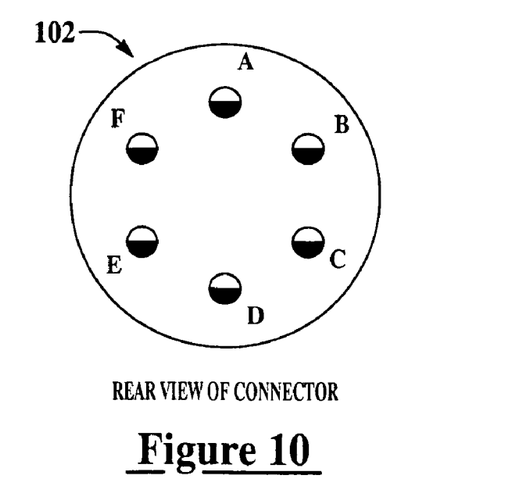
FIG. 10 illustrates a plug map view of contacts A-F associated with the plug shown in FIG. 9.
Figure 11:
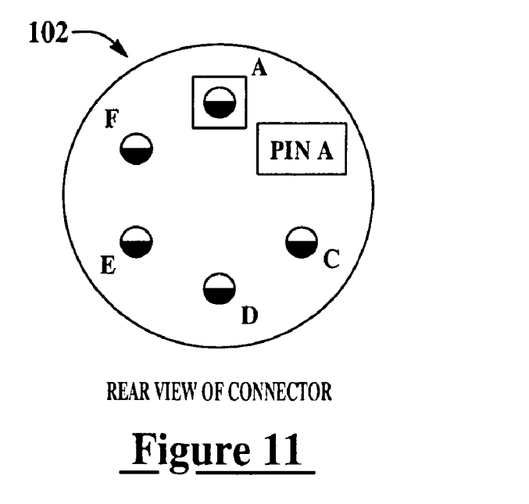
FIG. 11 illustrates how each contact on the plug map view may be selected, wherein when a contact such as Contact A is selected, the system is set to show related information.

In operation, a user can trouble shoot a problem with the right proximity switch 148S1 for the landing gear and accesses the locater diagram 100 as shown in FIG. 9 by examining the plug or connector 148P2 to determine if a contact is damaged, and then diagnosing the damaged contact to determine if a plug repair is necessary. Initially a user of the Intelligent Graphics Plug Map System 20 selects the plug 148P2 within the locater diagram 100. Once the plug 148P2 is selected, a plug map view 102 of the plug 148P2 is shown in FIG. 10-11; wherein the plug map view shows the diagram associated with the connector in the system database 30. FIG. 10 illustrates contacts A-F associated with the plug 148P2. The plug map view 102 may be displayed by selecting a plug map tab on an intelligent graphics viewer. FIG. 11 illustrates how each contact on the diagram may be selected, wherein when a contact such as Contact A is selected, the system is set to show related information.

Figure 12:
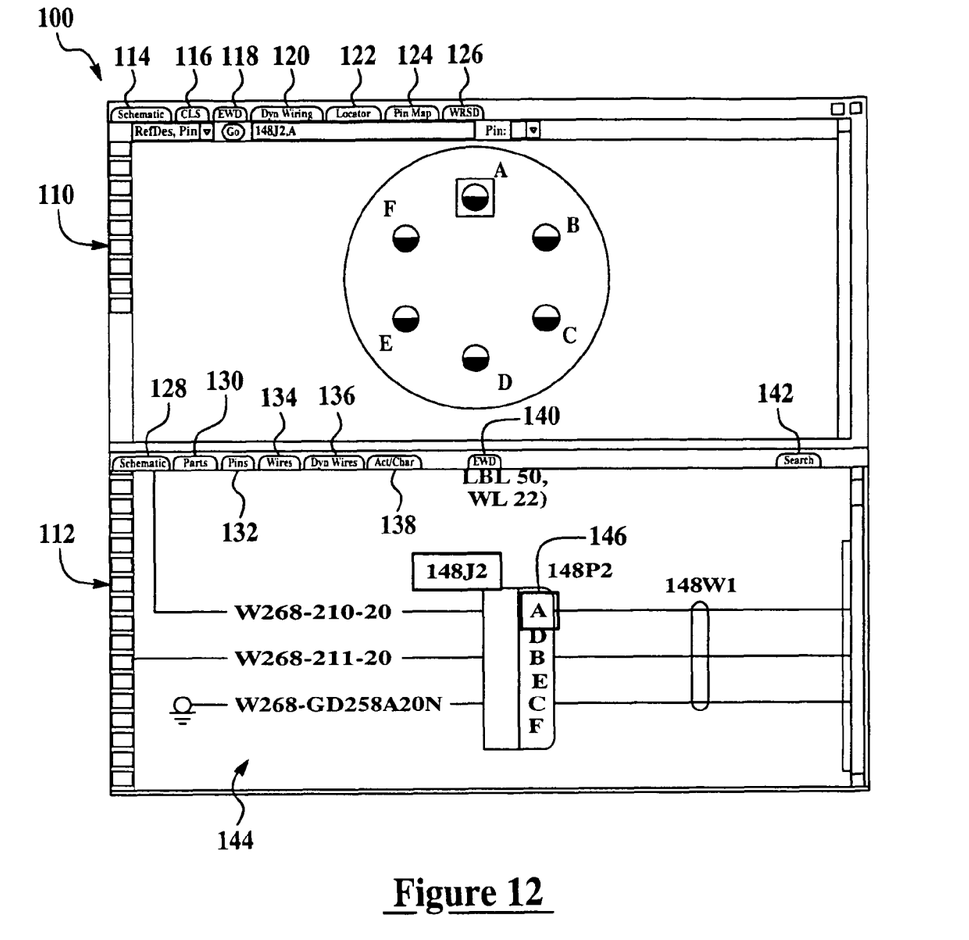
FIG. 12 illustrates an intelligent graphical viewer that allows a user to interact with the Intelligent Graphics Plug Map System used to identify connectors on an aircraft.

FIG. 12 illustrates an intelligent graphical viewer 108 that allows a user to interact with the Intelligent Graphics Plug Map System used to identify connectors on an aircraft. The Intelligent Graphics Plug Map System view 108 has an upper screen 110 and a lower screen 112, wherein the upper screen 110 illustrates information related to a specific connector and the lower screen illustrates information relating to the connector in association with wiring harnesses associated with the connector. The upper screen 110 has associated intelligent graphical user interface (IGUI) tabs labeled Schematic 114, CLS 116, EWD 118, Dyn Wiring 120, Locator 122, Plug map 124, WRSD 126. The lower screen has associated IGUI tabs labeled Harness 128, Parts 130, Contacts 132, Wires 134, Dyn Wires 136, Act/Char 138, EWD 140, and Search 142.

When the Contact A is selected on the plug map view 102 and the reference designator 148P2 is selected, the system automatically navigates to the correct plug map as shown in FIG. 12.

As shown in FIG. 12, when contact A is selected by using a contact hot spot and tool tip, the system 20 automatically associates the contact A with a corresponding wiring diagram 144 by highlighting the connector reference designator (148P2), contact (A) and the wires W268-210-20, W268-211-20, W268-GD258A20N associated with the wiring harness W268 that are in electrical communication with and are attached to the contact A. Alternatively, a user may also select a contact 146 in the wiring diagram and view the selected contact highlighted on the plug map view 102.

Figure 13:
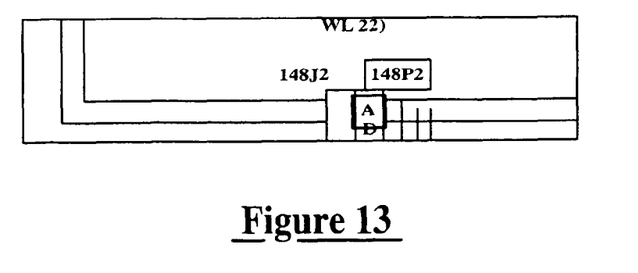
FIG. 13 illustrates how the system automatically identifies wiring diagrams by highlighting the wiring diagrams associated with a specific contact when an electrical signal is transmitted through the contact.

FIG. 13 illustrates how the system 20 automatically identifies wiring diagrams by highlighting the wiring diagrams associated with contact A when an electrical signal is transmitted through contact A.

Figure 14:
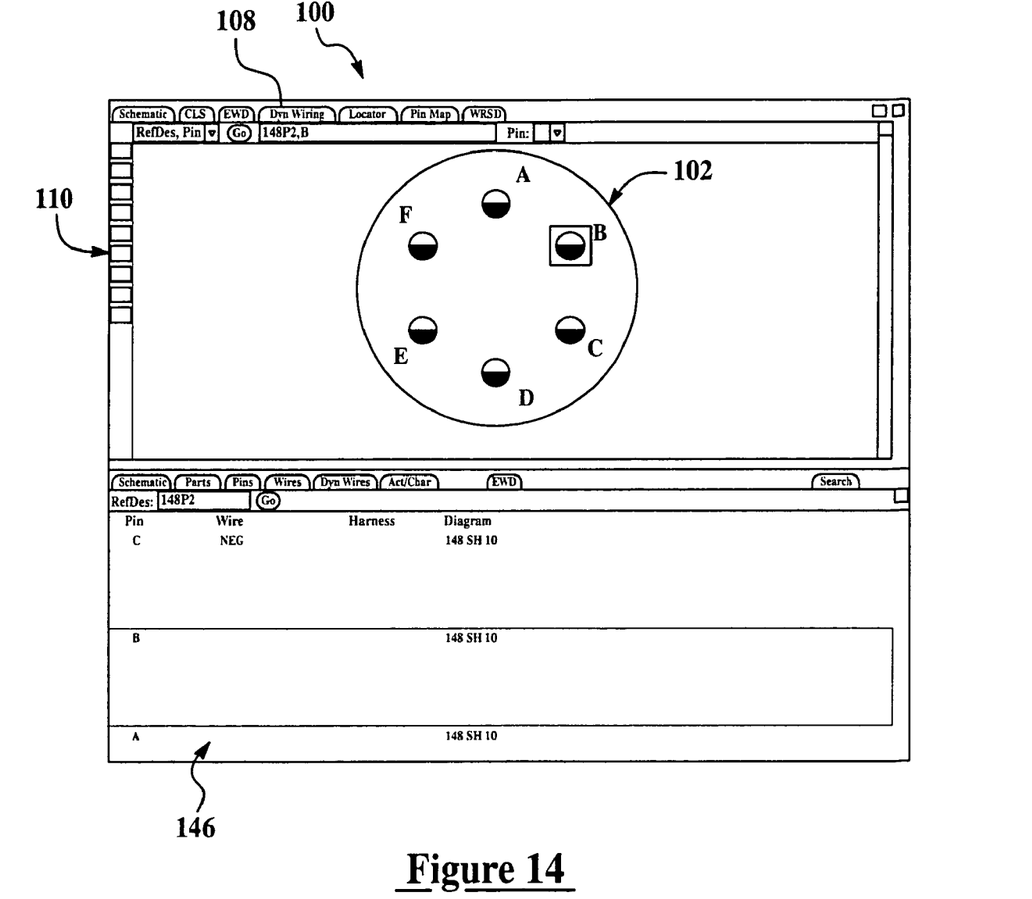
FIG. 14 illustrates the selection of the contacts tab which operates to display each Contacts' tabular view lists and highlights the contacts on the Plug map diagram in a contacts tab view.

FIG. 14 illustrates the selection of the contacts tab 132 which operates to display each Contacts tabular view lists and highlights the contacts on the Plug map diagram in a contacts tab view 146. As shown in FIG. 14, only three of the contacts, A, B, and C, are active for this aircraft.

Figure 15:
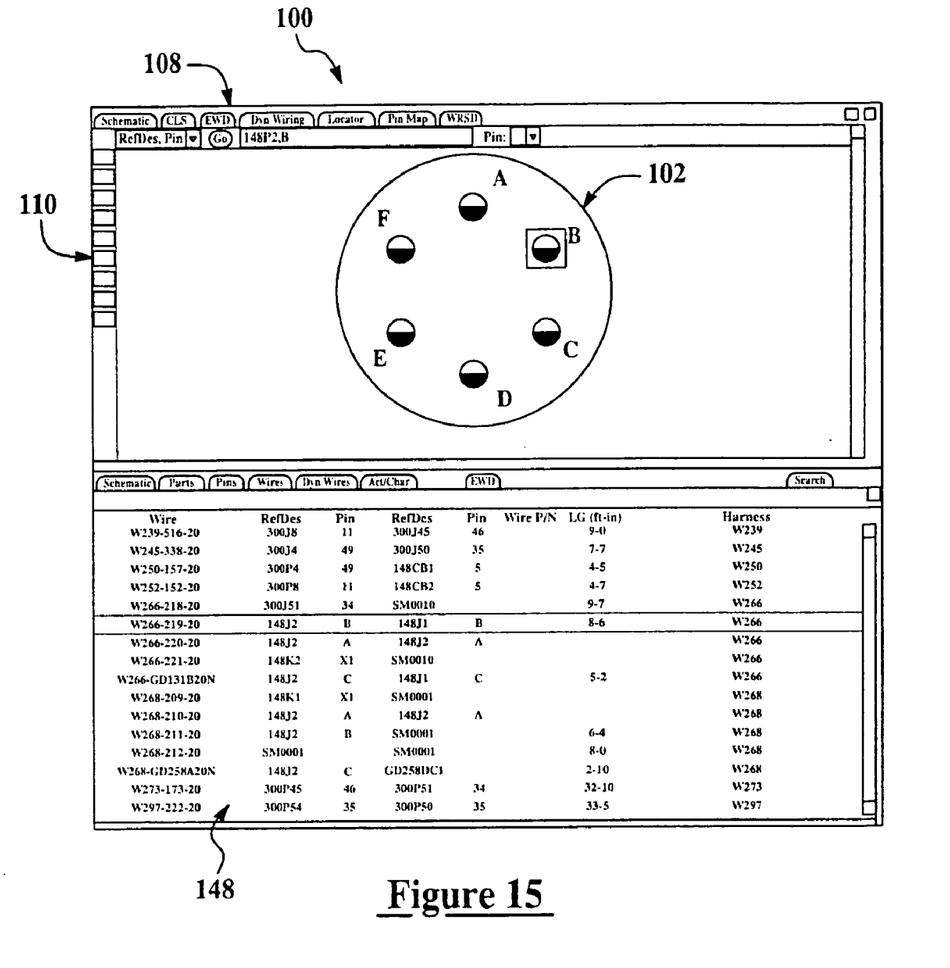
FIG. 15 illustrates the selection of the wires tab which operates to display a Wire List and also lists and highlights associated contacts and connectors in a wires screen view.

FIG. 15 illustrates the selection of the wires tab 134 which operates to display the Wire List and also lists and highlights associated contacts and connectors in a wires screen view 148.

Figure 16:
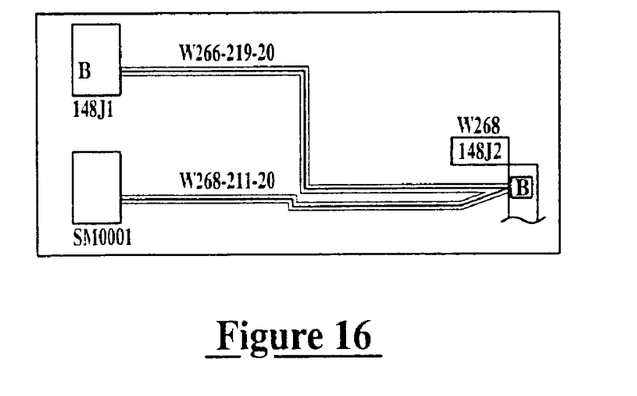
FIG. 16 illustrates a graphical representation of how the Intelligent Graphics Plug Map System can generate a diagram of the signal path through any selected contact.

FIG. 16 illustrates use of the Technical Data System to dynamically create and draw wiring diagrams directly from the database 30. FIG. 16 illustrates a graphical representation of how the Intelligent Graphics Plug Map System 20 can generate a diagram of the signal path through any selected contact.

While several aspects have been presented in the foregoing detailed description, it should be understood that a vast number of variations exist and these aspects are merely an example, and it is not intended to limit the scope, applicability or configuration of the invention in any way. Rather, the foregoing detailed description provides those of ordinary skill in the art with a convenient guide for implementing a desired aspect of the invention and various changes can be made in the function and arrangements of the aspects of the technology without departing from the spirit and scope of the appended claims.

What is claimed is:

1. A system comprising:
    a recognizer to associate contact labels with respective electrical contacts of an electrical plug map, the electrical plug map comprising a graphics file that represents a physical layout of the electrical contacts associated with an electrical connector plug, wherein the recognizer is to analyze text and distances between the electrical contacts of the electrical plug map to determine a type of electrical contact physical layout of the electrical connector plug and to associate the contact labels with the electrical contacts;
    a file builder to generate a plug map file from the electrical plug map using the associations between the contact labels and the electrical contacts, wherein the plug map file comprises:
        an interactive object associated with at least one of the electrical contacts;

a file version of the electrical plug map including at least one hot spot corresponding to at least one of the electrical contacts, the hot spot comprising visual feedback indicating user selectable information; and user selectable interactive links to data stored in a system database;

a technical data system application to synchronize a plurality of plug map views identifying electrical interconnectivity data associated with the electrical connector plug when a contact associated with the plug map file is selected by a user; and an interactive graphical interface comprising a graphical viewer including a plurality of selectable graphical user interface tabs for displaying the plurality of plug map views, wherein at least one of the recognizer, the file builder, or the technical data system application is implemented using a processor.

2. The system of claim 1, wherein the electrical plug map is a partially labeled plug map when received by the recognizer.

3. The system of claim 1, wherein the recognizer is to identify the electrical plug map as a spiral plug map or a column and row oriented plug map based on the analysis of the text and distances.

4. The system of claim 1, wherein the system database is to store the plug map views and a plurality of plug map files.

5. The system of claim 1, wherein the electrical plug map comprises a vector plug map or a raster plug map.

6. The system of claim 1, wherein analyzing the text and the distances to determine the type of electrical contact physical layout of the electrical connector plug comprises using one or more of a proximity analysis, a pattern-matching technique, or a logical inference.

7. A method, comprising:

associating contact labels with respective electrical contacts of a plug map to form a labeled plug map, wherein the labeled plug map is initially a partially labeled spiral plug map, the labeled plug map comprising a graphics file that represents a physical layout of the electrical contacts associated with an electrical connector plug, wherein associating the contact labels with the electrical contacts comprises comparing a first distance between a first one of the electrical contacts and a second one of the electrical contacts to a second distance between the first electrical contact and a third one of the electrical contacts;

labeling the partially labeled spiral plug map by:

identifying an outermost contact circle path defined by a plurality of circularly arranged contacts;

identifying a point which is closest to a highest or a lowest numerically labeled contact on the outermost contact circle path;

compiling a list of contacts in a plurality of concentric contact circle paths in a clockwise manner when the highest numerically labeled contact is located on the outermost contact circle path;

compiling a list of contacts in a plurality of concentric contact circle paths in a counter-clockwise manner when the lowest numerically labeled contact is located on the outermost circle path; and incrementing inwardly one circle path from a completed revolution around a last circle path;

generating, via a processor, a plug map file using the associations between the contact labels and the electrical contacts; and synchronizing a plurality of plug map views when a contact associated with the plug map file is selected by a user, and wherein the plug map file comprises:

an interactive object associated with at least one of the electrical contacts; and user selectable interactive links to data stored in a system database.

8. The method of claim 7, further comprising creating a markup language contact information file from the labeled plug map.

9. The method of claim 7, further comprising assigning associated labels to the corresponding contacts on the plug map such that a sum of distances among all of the electrical contacts is minimized.

10. The method of claim 7, further comprising using a first markup language contact information file to generate a second markup language file associated with the plug map file, the first markup language contact information file comprising searchable text information and interactive links associated with the electrical contacts.

11. The method of claim 7, further comprising including a hot spot corresponding to at least one contact in the plug map file, the hot spot comprising visual feedback indicating user selectable information.

12. The method of claim 7, further comprising displaying the plurality of plug map views via a graphical viewer, the graphical viewer comprising an interactive graphical interface including a plurality of selectable graphical user interface tabs for displaying the plurality of plug map views.

13. The method of claim 7, wherein analyzing the text and the distances to determine the type of electrical contact physical layout of the electrical connector plug comprises using one or more of a proximity analysis, a pattern-matching technique, or a logical inference.

* * * * *